(12) United States Patent
Zebian et al.

(10) Patent No.: US 12,550,300 B2
(45) Date of Patent: Feb. 10, 2026

(54) ORGANIC RANKINE CYCLE FOR DATA CENTER ELECTRONICS COOLING AND THERMAL ENERGY RECOVERY

(71) Applicant: Western Digital Technologies, Inc., San Jose, CA (US)

(72) Inventors: Hussam Zebian, Milpitas, CA (US); Toshiki Hirano, San Jose, CA (US); Neale Jones, Morgan Hill, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 115 days.

(21) Appl. No.: 18/412,510

(22) Filed: Jan. 13, 2024

(65) Prior Publication Data
US 2025/0234496 A1 Jul. 17, 2025

(51) Int. Cl.
*H05K 7/20* (2006.01)

(52) U.S. Cl.
CPC ......... *H05K 7/208* (2013.01); *H05K 7/20309* (2013.01)

(58) Field of Classification Search
CPC ........ F01K 23/10; F01K 19/04; F01K 21/005; F01K 27/00; F02G 2260/00; F02G 5/02; H05K 7/20309; H05K 7/2079; H05K 7/20936; H05K 7/20318; H05K 7/208
See application file for complete search history.

(56) References Cited

U.S. PATENT DOCUMENTS

| 5,664,419 A * | 9/1997 | Kaplan | F03G 4/074 60/641.5 |
| 6,989,989 B2 * | 1/2006 | Brasz | H01L 23/427 361/699 |
| 8,375,716 B2 * | 2/2013 | Ramaswamy | F01K 25/10 60/641.1 |
| 9,143,392 B2 | 9/2015 | Duchesneau | |

(Continued)

FOREIGN PATENT DOCUMENTS

CN 104329132 A * 2/2015

OTHER PUBLICATIONS

Israel Patent Office (ISA/IL), PCT International Search Report and Written Opinion for counterpart International application No. PCT/US2025/010592, May 4, 2025, 9 pages.

(Continued)

*Primary Examiner* — Mandeep S Buttar
(74) *Attorney, Agent, or Firm* — John D. Henkhaus

(57) ABSTRACT

A technique for recovering power from data center waste heat involves an organic Rankine cycle which includes pumping an organic working fluid through a low-temperature preheater chamber configured to exchange relatively low-temperature waste heat from low-temperature data storage devices to the organic working fluid flowing through the preheater chamber, pumping the working fluid through a high-temperature evaporator thermally coupled with the preheater chamber and configured to exchange relatively high-temperature waste heat from high-temperature CPUs to the working fluid flowing through the evaporator, and pump- (Continued)

ing the working fluid vapor from the evaporator to an expander for generating power via expansion of the working fluid. The preheater and evaporator may be directly incorporated with the enclosure box housing the various heat-generating components.

20 Claims, 7 Drawing Sheets

(56) References Cited

U.S. PATENT DOCUMENTS

| | | | |
|---|---|---|---|
| 10,285,310 | B2 | 5/2019 | Bonar et al. |
| 12,180,861 | B1* | 12/2024 | Bodishbaugh ........... F01K 25/06 |
| 2009/0120618 | A1* | 5/2009 | Konig ..................... F01K 15/00 |
| | | | 165/104.21 |
| 2010/0018207 | A1 | 1/2010 | Juchymenko |
| 2010/0146996 | A1 | 6/2010 | Campbell et al. |
| 2011/0016863 | A1 | 1/2011 | Ernst |
| 2012/0279233 | A1 | 11/2012 | Chainer et al. |
| 2020/0113085 | A1* | 4/2020 | Schon ..................... F25D 17/02 |

OTHER PUBLICATIONS

Araya, Sebastian et al., Organic Rankine Cycle as a Waste Heat Recovery System for Data Centers: Design and Construction of a Prototype, 17th IEEE Itherm Conference, 2018, 9 pages, IEEE.

Tipton, Russell et al., Experimental lessons of an organic Rankine cycle applied for waste heat recovery in a data center environment, Vertiv White Paper, 2023, pp. 1-18, Vertiv.com, downloaded at https://www.vertiv.com/49d45e/globalassets/documents/white-papers/vertiv-experimental-lessons-of-organic-rankine-wp-en-na-sl-71085-web_383464_0.pdf.

Jung, Hyung-Chul et al., An experimental and modelling study of a 1 KW organic Rankine cycle unit with mixture working fluid, Energy (2015), Accepted Jan. 2, 2015, pp. 1-14, Elsevier Ltd., downloaded at https://www.sciencedirect.com/science/article/abs/pii/S0360544215000109.

Kumar, Anurag et al., A critical review on waste heat recovery utilization with special focus on Organic Rankine Cycle applications, Cleaner Engineering and Technology 5 (2021) 100292, Accepted Oct. 5, 2021, Available online Oct. 8, 2021, pp. 1-23, Elsevier Ltd., downloaded at https://www.sciencedirect.com/science/article/pii/S2666790821002524.

Larsen, Ulrik et al., Design and optimisation of organic Rankine cycles for waste heat recovery in marine applications using the principles of natural selection, Energy, 55, 803-812, 2013, pp. 1-13, DTU, downloaded at https://backend.orbit.dtu.dk/ws/portalfiles/portal/55474783/Design_and_optimisation_postPrint.pdf.

Jaaskelainen, Hannu, Rankine Cycle Waste Heat Recovery, Energy, 55, 803-812 (2013), 3 pages, ECOpoint Inc., downloaded at https://dieselnet.com/tech/engine_whr_rankine.php.

Quolin, Sylvain et al., Dynamic modeling and optimal control strategy of waste heat recovery Organic Rankine Cycles, Applied Energy 88 (2011) 2183-2190, Accepted Jan. 5, 2011, Elsevier Ltd, downloaded at https://www.sciencedirect.com/science/article/abs/pii/S0306261911000183.

* cited by examiner

ORGANIC RANKINE CYCLE FOR DATA CENTER ELECTRONICS COOLING AND THERMAL ENERGY RECOVERY

FIELD OF EMBODIMENTS

Embodiments of the invention may relate generally to electronics equipment, and particularly to approaches to recovering power from data center waste heat.

BACKGROUND

As networked computing systems grow in numbers and capability, there is a need for more storage system capacity. Cloud computing and large-scale data processing further increase the need for digital data storage systems that are capable of transferring and holding significant amounts of data. One approach to providing sufficient data storage in data centers is the use of arrays of data storage devices. Many data storage devices can be housed in an electronics enclosure (sometimes referred to as a "rack"), which is typically a modular unit that can hold and operate independent data storage devices, computer processors, switches, routers and other electronic equipment (e.g., collectively, a "box"). Data centers typically include many rack-mountable "boxes" that are used to store and process the large amounts of data. It is well-known that data storage and data processing consumes a significant amount of power. Likewise, it is well-known that such power is dissipated in the form of heat, which requires significant cooling and related costs.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Figure 1A:
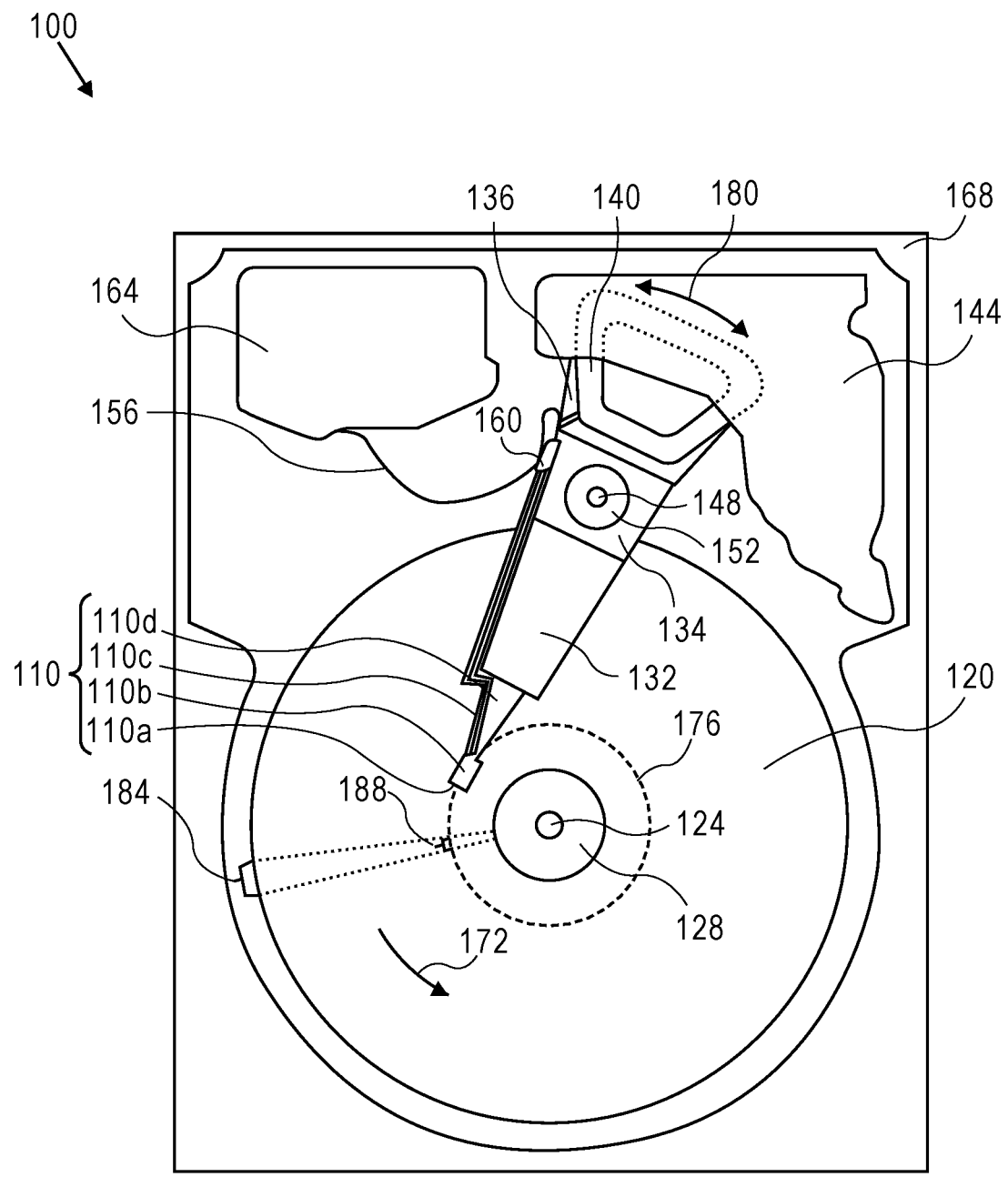
FIG. 1A is a plan view illustrating a hard disk drive (HDD), according to an embodiment.

Approaches to recovering power from data center waste heat are described. In the following description, for the purposes of explanation, numerous specific details are set forth to provide a thorough understanding of the embodiments of the invention described herein. It will be apparent, however, that the embodiments of the invention described herein may be practiced without these specific details. In other instances, well-known structures and devices are shown in block diagram form to avoid unnecessarily obscuring the embodiments of the invention described herein.

Introduction

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment or to every embodiment.

If used herein, the term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Physical Description of an Illustrative Operating Context-Data Storage Systems and Data Centers There is a commercial demand for high-capacity digital data storage and processing systems (generally, a data storage system or "DSS'), in which multiple data storage devices (DSDs) such as hard disk drives (HDDs), solid-state (e.g., flash memory based) drives (SSDs), tape drives, hybrid drives, and the like are housed in a common enclosure. A data storage system (may be referred to generally as a "server") often includes a large enclosure (or "box") that houses multiple slots or rails in or on which rows of DSDs are mounted, whereby each box may in turn be placed or slid onto a corresponding shelf or rail within a rack or cabinet. Each DSD is communicatively coupled with a system controller, such as via a backplane or otherwise, where a system controller may be housed for example in a DSS box along with the DSDs for controlling those DSDs. Additionally, system controllers may be housed elsewhere throughout a rack for controlling the storage/computing system more broadly. Typically, each rack may further house routers, switches, a patch panel, storage server(s), application server(s), a power supply, cooling fans, etc.

Generally, a data center (or, more generally, "mass storage system") may be likened to an extreme version of a data storage system (or multiple data storage systems working together), along with the power, cooling, space, and the like, needed to operate the storage, management, processing, and sharing of data as well as the corresponding network infrastructure (e.g., routers, switches, firewalls, application-delivery controllers, and the like). Expanding on that notion, a "hyperscale" data center generally refers to a facility providing robust, scalable applications and storage services to individuals or other businesses. Exemplary implementations of hyperscale computing include cloud and big data storage, web service and social media platforms, enterprise data centers, and the like, which may consist of thousands of servers linked by an ultra-high speed fiber network.

Figure 2:
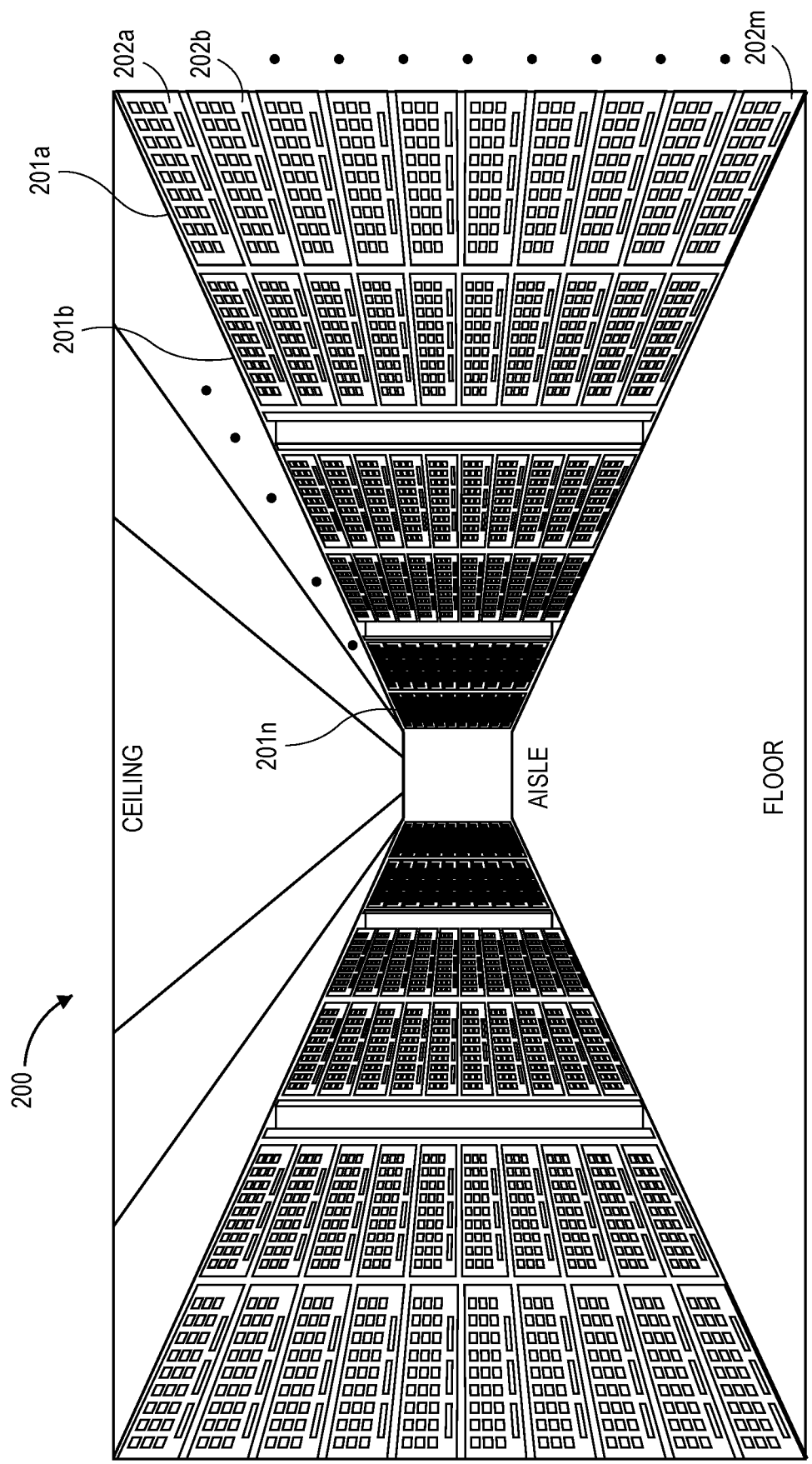
FIG. 2 is a perspective view illustrating a datacenter.

FIG. 2 is a perspective view illustrating a datacenter. Simply exemplified here, data center 200 comprises multiple racks 201a, 201b-201n situated along a row, where n represents an arbitrary number of racks that may vary from implementation to implementation, with each rack 201a-201n housing multiple DSS servers 202a, 202b-202m (or simply "DSS 202a-202m"), where m represents an arbitrary number of DSS boxes that may vary from implementation to implementation. Each DSS 202a-202m typically comprises multiple DSDs (e.g., HDDs and/or SSDs) as discussed elsewhere herein. As is well-known and can be readily understood, the various electronics components constituent to a data center such as data center 200 naturally generate a non-trivial amount, indeed a significant amount, of heat (i.e., primarily due to electrical resistance). Thus, there remain ongoing challenges regarding how to dissipate the heat generated by operation of electronics components, especially to the scale of heat generated by a vast data center.

Figure 3:
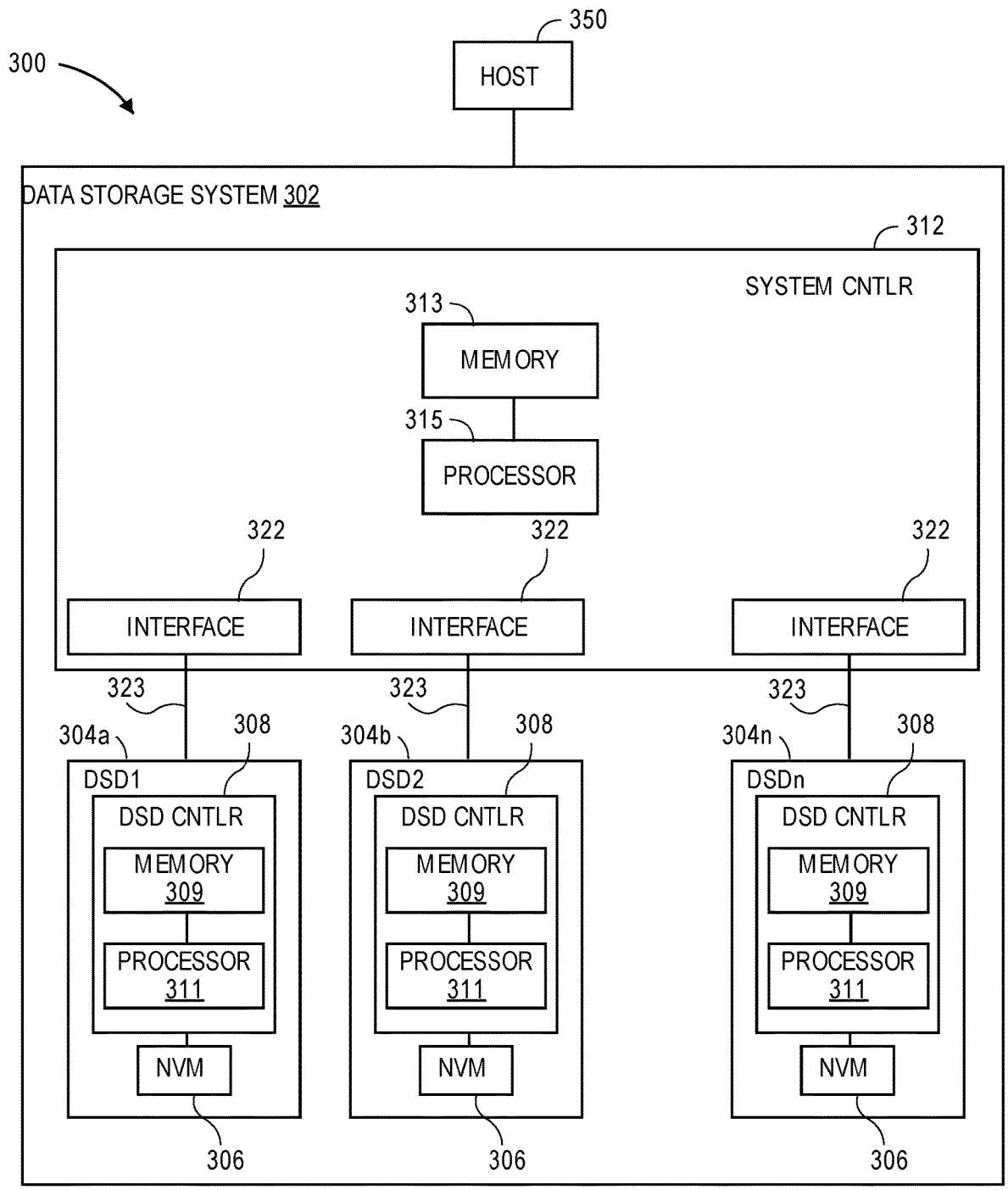
FIG. 3 is a block diagram illustrating a data storage system architecture, according to an embodiment.

An example data storage system may comprise multiple DSDs such as SSDs and/or HDDs, each communicative with and under the control of a system controller (or, e.g., I/O (Input/Output) controller or I/O compute circuit board) via a communication interface circuitry according to a corresponding communication protocol. FIG. 3 is a block diagram illustrating a data storage system architecture, according to an embodiment. Example architecture 300 illustrates a data storage system 302 that comprises multiple data storage devices (DSDs) 304a (DSD1), 304b (DSD2), and 304n (DSDn), where n represents an arbitrary number of DSDs (e.g., SSDs and/or HDDs) that may vary from implementation to implementation. Each DSD 304a-304n is communicative with and under some level of control by a storage system controller 312, via a communication interface 322 (e.g., electronic circuitry including electrical connectivity means) according to a corresponding communication protocol 323. Each DSD 304a-304n includes corresponding non-volatile memory (NVM) 306 (e.g., typically in the form of electronic non-volatile memory such as non-volatile memory components 170a-170n of FIG. 1B in the case of SSDs, or spinning magnetic disk media such as recording medium 120 of FIG. 1A in the case of HDDs) controlled by a respective DSD controller 308 ("DSD CNTLR" 308). Each DSD controller 308 includes at least a memory 309 and a processor 311, while the system controller 312 also includes at least a memory 313 and a processor 315. DSD controller 308 and system controller 312 may each be embodied in any form of and/or combination of software, hardware, and firmware. An electronic controller in this context typically includes circuitry such as one or more processors for executing instructions, and may be implemented as a System on a Chip (SoC) electronic circuitry, which may include a memory, a microcontroller, a Digital Signal Processor (DSP), an ASIC, a Field Programmable Gate Array (FPGA), hard-wired logic, analog circuitry and/or a combination thereof, for non-limiting examples.

The data storage system 302 may be communicatively coupled with a host 350, which may be embodied in a hardware machine on which executable code executes (for non-limiting examples, a computer or hardware server, and the like), or as software instructions executable by one or more processors (for non-limiting examples, a software server such as a database server, application server, media server, and the like). Host 350 generally represents a client of the data storage system 302, and has the capability to make read and write requests ("I/O") to the data storage system 302. Note that the system controller 312 may also be referred to as a "host" because the term is often generally used in reference to any device that makes I/O calls to a data storage device or an array of devices, such as DSDs 304a-304n. Host 350 interacts with one or more DSDs 304a-304n via the interface 322 (e.g., a physical and electrical I/O interface) for transferring data to and from the DSDs 304a-304n, such as via a bus or network such as Ethernet or Wi-Fi or a bus standard such as Serial Advanced Technology Attachment (SATA), PCI (Peripheral Component Interconnect) express (PCIe), Small Computer System Interface (SCSI), or Serial Attached SCSI (SAS), for non-limiting examples.

Context

Recall that data centers consume a significant amount of power in operation, and that such power generates a significant amount of heat, and that such waste heat requires significant cooling. Furthermore, the significant cooling needed for a data center incurs a high monetary cost and often a high environmental cost. One possible approach to this challenge may be to utilize compact thermoelectric generator(s) that convert heat flux directly into electrical energy. However, a thermoelectric generator is considered relatively inefficient. Another possible approach may be to utilize a simple Stirling cycle for self-cooling. However, this approach is also considered relatively inefficient due to low compression ratio and low flux (i.e., the working fluid is a gas) and thus is not considered suitable for high power scenarios such as a data center.

Data Center Organic Rankine Cycle (ORC)

By contrast with the approaches mentioned, use of an Organic Rankine Cycle ("ORC") for waste heat recovery/power generation in a data center scenario is considered suitable for the intended purpose at least in part because of the high flux, i.e., boiling and condensation is utilized, the relatively high efficiency of the thermodynamic cycle, and the unique saturation curves of organic working fluids. Elaborating upon the use of an organic working fluid in an ORC, properties of the saturation curve for water limits its benefits for the intended purpose, as expansion of saturated steam will go into two-phase region and liquid water reduces efficiency and significantly shortens turbine lifetime. Further, employing super heating is a challenge due to low flux of heating steam. By contrast, organic working fluids have unique saturation curves, wherein expanding saturated fluid results in vapor further in the super heat region, so turbines can work efficiently and the flux can be used more aggressively, e.g., utilizing expansion beyond the saturation boundary. In view of the foregoing, and according to an embodiment, ASHRAE (American Society of Heating, Refrigeration and Air-Conditioning Engineers) number R365 refrigerant ($C_4H_5F_5$, chemical name 1,1,1,3,3-Pentafluorobutane) is considered a suitable organic working fluid for the intended purpose, at least in part due to maximum Carnot efficiency and ideal cycle efficiency and further in view of the relevant temperature differences and reasonable pressure ranges.

Figure 4:
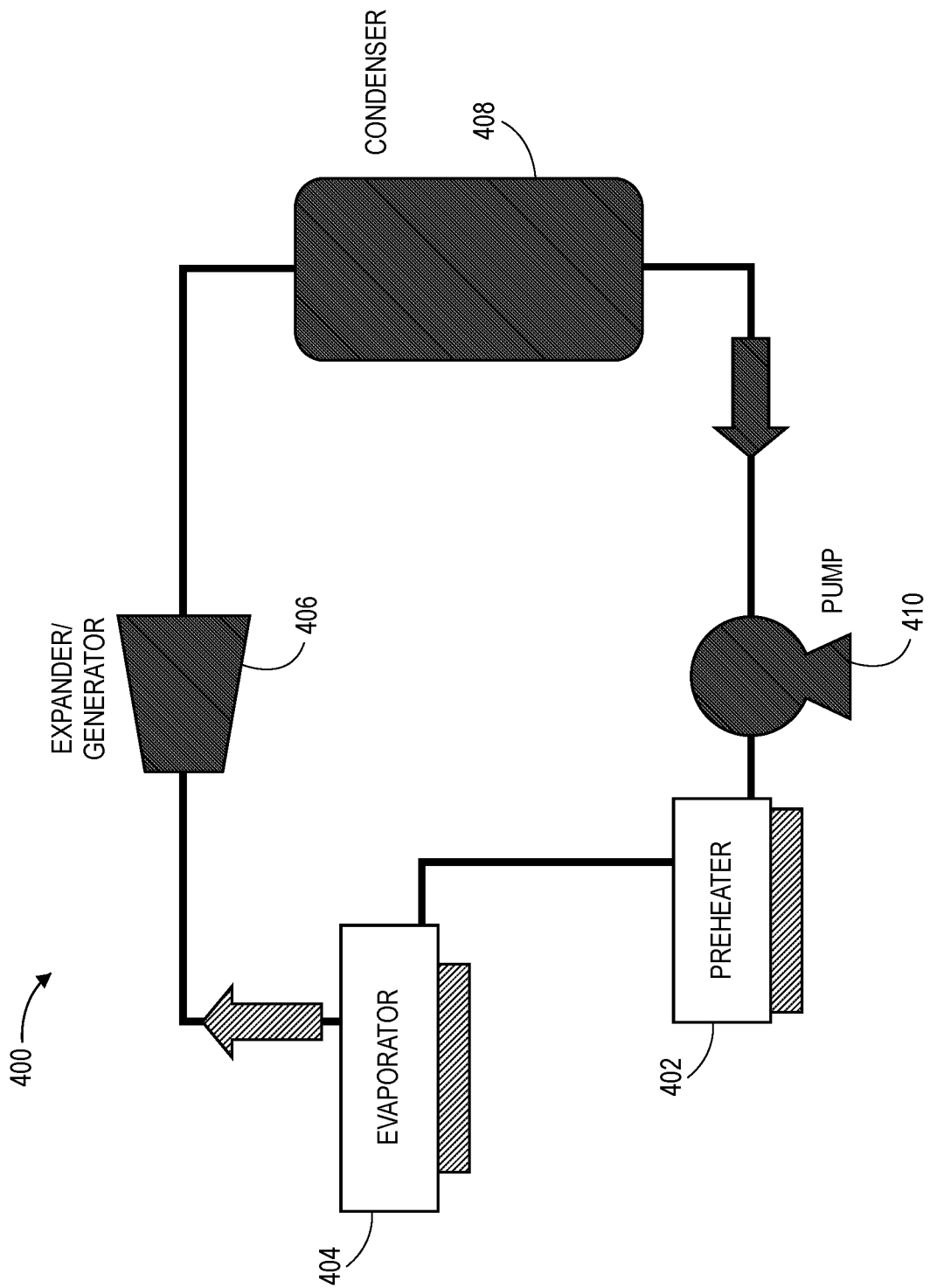
FIG. 4 is a functional diagram illustrating a datacenter Organic Rankine Cycle architecture, according to an embodiment.

FIG. 4 is a functional diagram illustrating a datacenter Organic Rankine Cycle architecture, according to an embodiment. Here, according to an embodiment the hot portion of the ORC 400 (depicted with a less dense crosshatch to represent "red" or "hot" portions) is referred to as multi-stage in that it utilizes a preheater 402 (may also be referred to as a feed working fluid heater) in conjunction with an evaporator 404 (may also be referred to as "a boiler" or "a superheater"). Here, the term "evaporator" is intended to include evaporative and/or boiling and/or superheating functionality, enabling sub- or super-critical cycles, and these terms may be used interchangeably herein. As such, some cycles may go through a super-critical phase, thereby operating at a high enough pressure that upon heating the working fluid in the evaporator (boiler/superheater) 404 the fluid properties pass above its saturation curve and there is no distinct phase change across the working fluid, i.e., where the fluid is no longer literally "evaporated". Typical to a Rankine thermodynamic cycle, the working fluid is pumped or otherwise passed through the preheater 402 (also "preheater chamber 402") and the evaporator 404 by a pump 410, with condensed working fluid feeding the pump 410 from a condenser 408 (depicted with a denser cross-hatch to represent "blue" or "cold" portions). Further, a vapor form of the working fluid flowing out of the evaporator 404 flows to an expander/generator 406 (or simply "expander 406", which may also be referred to as a turbine or turbine/generator) for expansion and generation of work/power. As depicted, ORC 400 represents a closed thermodynamic cycle. While not necessary, a closed cycle is more efficient at least in part because the working fluid can be expanded to the saturation pressure of the atmospheric temperature. For a non-limiting example, R365 working fluid may be expanded to 0.56 atm (atmosphere) at 25° C., whereas in an open cycle the working fluid would be expanded to the atmospheric pressure of 1 atm.

Here, this multi-stage heat cycle preheater 402 comprises a low-temperature preheater chamber configured to intake low-temperature waste heat from one or more relatively low-temperature electronic components, e.g., from a data center such as data center 200 (FIG. 2), and to exchange the low-temperature waste heat to an organic working fluid flowing through the preheater 402. According to an embodiment, the low-temperature waste heat is heat generated from relatively low-temperature IT (information technology) electronic components such as data storage devices (e.g., HDDs and SSDs, such as DSD1-DSDn (304a-304n) of data storage system 302 of FIG. 3, emanating heat at around 60°-80° C. for example), which may be housed in an electronics enclosure (see, e.g., enclosure 501 of FIG. 5). Furthermore, this multi-stage heat cycle evaporator 404 comprises a high-temperature evaporator in fluid communication in series with the preheater 402 and configured to intake high-temperature waste heat from one or more relatively high-temperature electronic components and to exchange the high-temperature waste heat to the organic working fluid flowing through the evaporator 404. According to an embodiment, the high-temperature waste heat is heat generated from relatively high-temperature IT electronic components such as system CPUs (e.g., processor 315 of system controller 312 of data storage system 302 of FIG. 3, emanating heat at around 100° C. for example), which may also be housed in the same or a different electronics enclosure (see, e.g., enclosure 501 of FIG. 5). ORC 400 further comprises the expander 406 to which the heated and evaporated organic working fluid is passed from the evaporator 404, for expansion within the expander 406 to extract power from the data center waste heat.

As the ORC 400 of FIG. 4 is a functional diagram, it is not intended to strictly convey a single possible or preferred architecture in which only singular cycle components (i.e., one preheater 402, one evaporator 404, one expander 406, one condenser 408, one pump 410) are implemented for an entire data center. Rather, the level of granularity of the ORC 400 component architecture may vary from implementation to implementation based on, for non-limiting examples, the desired thermodynamic cycle efficiency and associated working fluid and corresponding saturation curves, flow rate, pressure, and the like, as well as practical and logistical considerations. For example, an ORC design may be implemented at a data center level whereby the working fluid is pumped, plumbed, routed by and thus in thermal exchange with all the low-temperature components in the entire data center (either in series or in parallel) before being pumped, plumbed, routed by and in thermal exchange with all the high-temperature components in the entire data center (either in series or in parallel), before being pumped, plumbed, routed for expansion in the expander 406. For another example, an ORC design may be implemented at a rack level whereby the working fluid is pumped, plumbed, routed by and thus in thermal exchange with all the low-temperature components in a given rack (either in series or in parallel) before being pumped, plumbed, routed by and in thermal exchange with all the high-temperature components in the rack (either in series or in parallel), before being combined and pumped, plumbed, routed for expansion in the expander 406.

Furthermore and according to an embodiment, the preheater 402 and the evaporator 404 are thermally coupled with an electronics enclosure in which the relatively low-temperature electronic components and the relatively high-temperature electronic components are housed (e.g., a "box"), and the organic working fluid flows from the preheater 402 to the evaporator 404. Stated otherwise, at least in part to maintain line-replaceable unit (LRU) capability, the preheater 402 and the evaporator 404 are configured as part of a given box or storage/computing unit along with the storage/compute electronic components that generate the waste heat.

Figure 5:
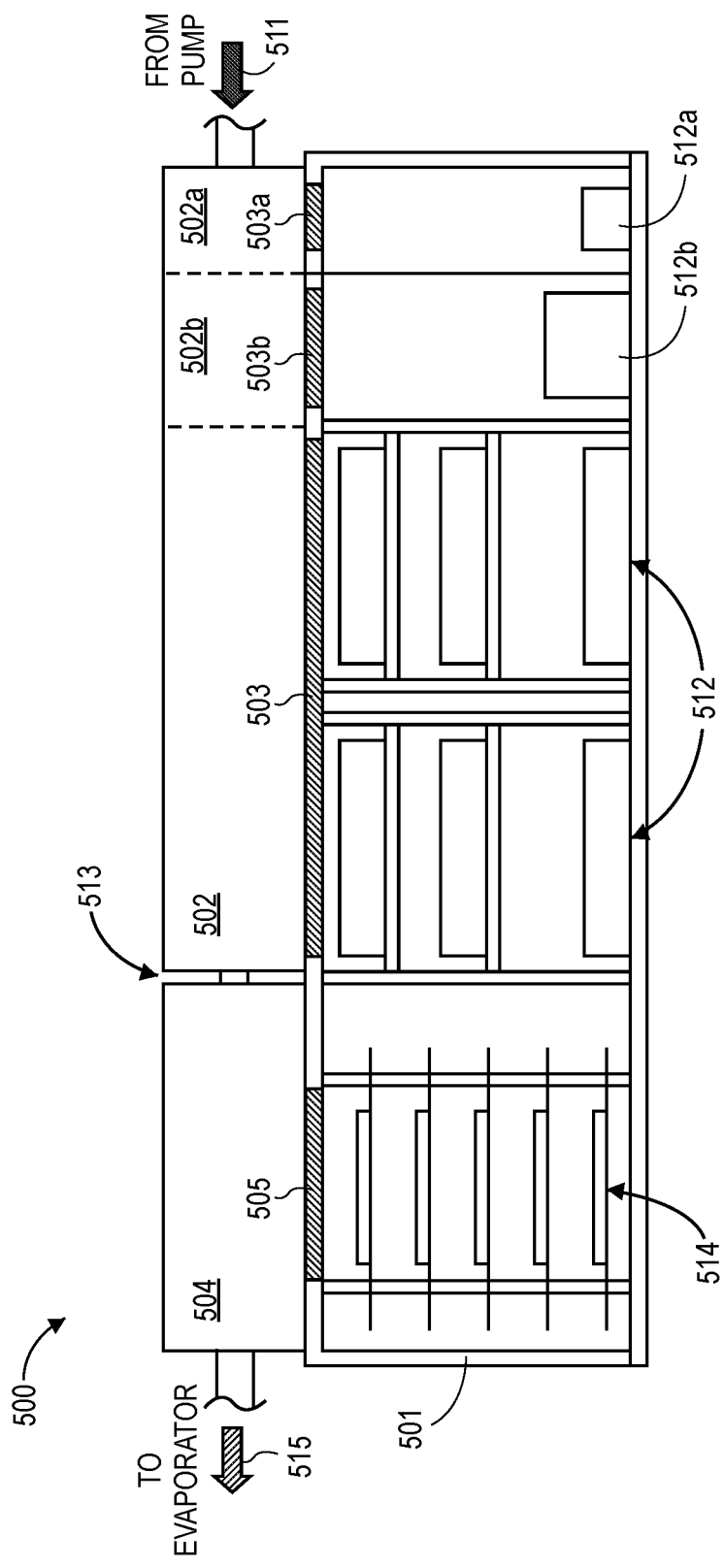
FIG. 5 is a diagram illustrating a thermal recovery data storage system, according to an embodiment.

FIG. 5 is a diagram illustrating a thermal recovery data storage system, according to an embodiment. Data storage system 500 (or "DSS 500") is depicted as a LRU or box, such as a product in its commercial form, in which stages of an ORC are integrated or otherwise incorporated. DSS 500 is depicted in a simplified diagram form, and comprises a preheater chamber 502 configured to function similarly to preheater 402 (FIG. 4), and an evaporator 504 configured to function similarly to evaporator 404 (FIG. 4), both of which are thermally coupled with (e.g., in a heat-exchangeable configuration/position with) portions of an enclosure 501. Here, the enclosure 501 to which the preheater chamber 502 and the evaporator 504 are thermally coupled (here also mechanically coupled) is the same enclosure in which the relatively low-temperature electronic components 512 (also, "low-temp components 512") and the relatively high-temperature electronic components 514 (also, "high-temp components 514") are also housed. As discussed and according to an embodiment, the low-temp components 512 may include data storage devices such as hard disk drives (HDDs) and/or solid-state drives (SDDs) (see, e.g., DSD1-DSDn (304a-304n) of data storage system 302 of FIG. 3) and any other similarly low-temp components emanating heat at around 60°-80° C. for non-limiting example, and the high-temp components 514 may include compute processors/central processing units (CPUs) (see, e.g., processor 315 of system controller 312 of data storage system 302 of FIG. 3) and any other high-temp components emanating heat at around 100° C. for non-limiting example.

Operationally, a "cold" organic working fluid 511 enters and flows through preheater chamber 502, thereby cooling the low-temp components 512 via exchange of the corresponding waste heat from the low-temp components 512 to the cold working fluid 511. Continuing, "warm" organic working fluid 513 flows from preheater chamber 502 to and through the evaporator 504, thereby cooling the high-temp components 514 via exchange of the corresponding waste heat from the high-temp components 514 to the warm working fluid 513 coming from the preheater chamber 502. The now "hot" working fluid 515, in its desired phase(s) suitable for its intended purpose of generating power through expansion, flows from evaporator 504 to one or more expanders such as expander 406 (FIG. 4). It is contemplated that each DSS 500 may be configured with its own expander 406. According to an embodiment, to assist in the heat exchange, the preheater chamber 502 is thermally coupled with the electronics enclosure 501 via one or more first heat exchanger 503, and the evaporator 504 is thermally coupled with the electronics enclosure 501 via one or more second heat exchanger 505.

As a given DSS 500 box may further comprise additional electronic components that may emanate heat in other temperature ranges away from those of the low-temp components 512 and the high-temp components 514, a system such as DSS 500 may be implemented in which one or more even lower-temperature preheater chamber 502a, 502b is in fluid communication with the low-temperature preheater chamber 502 and configured to intake lower-temperature waste heat, having a lower temperature than the low-temperature waste heat, from one or more relatively lower-temperature electronic components 512a, 512b, and to exchange the lower-temperature waste heat to the organic working fluid flowing through each lower-temperature preheater chamber 502a, 502b to the low-temperature preheater chamber 502. Thus, a gradient of preheat functionality may be implemented to gradually preheat the working fluid for passing to evaporator 504 for further heating, boiling, evaporating. Here also the lower-temperature electronic components 512a, 512b may be thermally coupled with the electronics enclosure 501 via one or more respective heat exchanger 503a, 503b to assist in the heat exchange process.

With a modular configuration enabled by an electronics unit such as DSS 500, a data center waste heat recovery ORC such as ORC 400 (FIG. 4) may likewise be modular or distributed to a desired extent. According to an embodiment, each of a plurality of preheater chambers 502 is thermally coupled with a corresponding electronics enclosure 501 in which corresponding relatively low-temperature electronic components 512 are housed, while each of a plurality of evaporators 504 is thermally coupled with a corresponding electronics enclosure 501, in which corresponding relatively high-temperature electronic components 514 are housed and with which a corresponding preheater chamber 502 is thermally coupled. Thus, a manifold may be configured to fluidly connect two or more of the evaporators 504 prior to passing to the expander 406. For non-limiting examples, the hot working fluid 515 (i.e., vapor) exiting each evaporator 504 may be combined at the rack level on its way to a shared expander 406 for multiple racks, or each rack may be configured with its own expander 406, and the like.

While the heat exchange functionality between low-temp components 512 and preheater chamber 502 and between high-temp components 514 and evaporator 504 are described in reference to FIG. 5 as utilizing surface contact between corresponding elements, two-phase immersion cooling technology is further contemplated for facilitating such heat exchange as an alternative to or augmentation of surface contact exchange. Generally, in two-phase immersion cooling, electronic components are directly immersed in dielectric liquid where heat from the electronic components causes the liquid to boil, producing vapor that rises from the liquid. As such and according to an embodiment, to maintain efficiency the low-temperature electronic components such as low-temp components 512 are immersed in the organic working fluid in a preheater chamber such as preheater 402 (FIG. 4) and the high-temp electronic components 514 are immersed in the organic working fluid in an evaporator such as evaporator 404 (FIG. 4). The low-temp components 512 may be housed in a corresponding sealed enclosure (e.g., a sealed enclosure 501) which is immersed in the working fluid (e.g., cold working fluid 511 to warm working fluid 513) corresponding to preheater 402, while the high-temp components 514 may be housed in a corresponding sealed enclosure (e.g., a sealed enclosure 501) which is immersed in the working fluid (e.g., warm working fluid 513 to hot working fluid 515) corresponding to evaporator 404.

Such an arrangement may be developed and implemented at the rack level, where a liquid-sealed rack houses liquid-sealed enclosures (housing the low-temp components 512 and/or the high temp components 514) in the working fluid. If each box such as DSS 500 has a mixture of low-temp components 512 and high-temp components 514, then the boiling temperature and pressure is dictated by the lowest temperature component and thus the cycle would have relatively low regeneration efficiency. Effectively in such scenario, the preheater chamber 402, 502 and the evaporator 404, 504 are configured as an integrated chamber in which the low-temperature electronic components 512 and the high-temperature electronic components 514 are immersed in the organic working fluid. As such and according to an embodiment, the boxes may be connected in parallel and the vapor would be summed from all to go to the expander 406. If each box is dedicated to a single type of components (e.g., low-temp or high-temp), then the boxes can be connected in series, where low temperature components are first in line and the feed working fluid flows gradually to boxes with higher temperature components, ultimately reaching an evaporator 404 corresponding to one or more of the boxes with the highest temperature components. Here too the vapor produced from one rack can be summed with the vapor produced by other racks before going to the expander 406.

Alternatively in the context of immersion cooling and regeneration, the working fluid may be pumped through cold plates attached to low-temperature and high-temperature components 512, 514, whereby the working fluid does not make direct contact with the electronic components.

Method for Recovering Power from a Data Center

Figure 6:
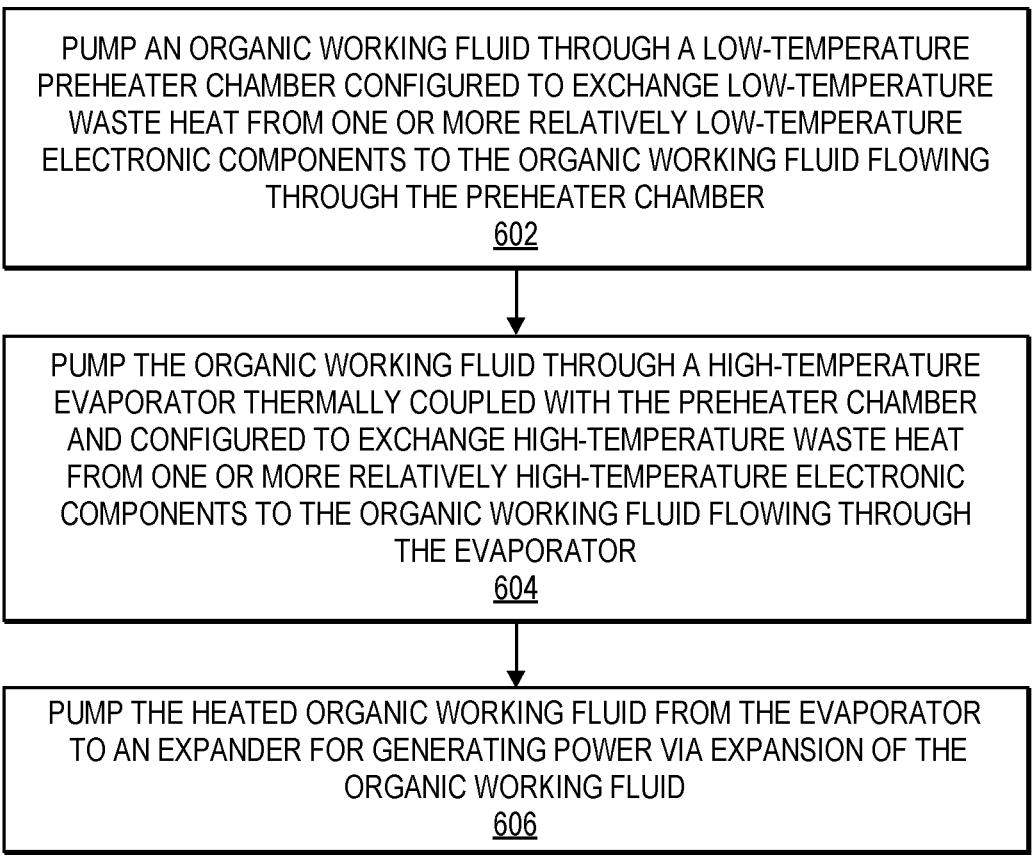
FIG. 6 is a flow diagram illustrating a method for recovering power from data center waste heat, according to an embodiment.

FIG. 6 is a flow diagram illustrating a method for recovering power from data center waste heat, according to an embodiment. An applicable data center may be that as exemplified as data center 200 of FIG. 2, housing multiple data storage systems such as exemplified as data storage system 302 of FIG. 3, which may be configured as a box such as exemplified as a thermal recovery DSS 500.

At block 602, pump an organic working fluid through a low-temperature preheater chamber configured to exchange low-temperature waste heat from one or more relatively low-temperature electronic components to the organic working fluid flowing through the preheater chamber. For example, "cold" organic working fluid 511 (FIG. 5) is pumped, e.g., by pump 410 (FIG. 4), through a low-temperature preheater chamber 402 (FIG. 4), 502 (FIG. 5) configured to exchange low-temperature waste heat from one or more relatively low-temperature electronic components 512 (FIG. 5) such as HDDs and/or SSDs to the organic working fluid 511-513 flowing through the preheater chamber 402, 502.

As discussed elsewhere herein, prior to moving the working fluid through the low-temperature preheater chamber 402, 502, the organic working fluid 511 may be pumped from one or more lower-temperature preheater chamber 502a, 502b (FIG. 5) thermally coupled with the low-temperature preheater chamber 502 and configured to exchange lower-temperature waste heat, having a lower temperature than the low-temperature waste heat, from one or more relatively lower-temperature electronic components 512a, 512b (FIG. 5) to the organic working fluid flowing through the lower-temperature preheater chamber 502a, 502b. Similarly, after moving the working fluid through the low-temperature preheater chamber 402, 502 and prior to moving the working fluid through the evaporator 404 (FIG. 4), 504 (FIG. 5), the organic working fluid 513 may be pumped from the low-temperature preheater chamber 402, 502 to another thermally coupled preheater chamber configured to exchange medium-temperature waste heat, having a higher temperature than the low-temperature waste heat but lower than the high temperature waste heat, from one or more relatively medium-temperature electronic components to the organic working fluid 513 flowing from the low-temperature preheater chamber 402, 502.

At block 604, pump the organic working fluid through a high-temperature evaporator thermally coupled with the preheater chamber and configured to exchange high-temperature waste heat from one or more relatively high-temperature electronic components to the organic working fluid flowing through the evaporator. For example, "warm" organic working fluid 513 (FIG. 5) is pumped (e.g., by pump 410) through high-temperature evaporator 404, 504 thermally coupled with the preheater chamber 402, 502 and configured to exchange high-temperature waste heat from one or more relatively high-temperature electronic components 514 (FIG. 5) such as CPUs to the organic working fluid 513-515 flowing through the evaporator 404, 504. Alternatively, the immersion cooling/regeneration techniques described elsewhere herein may be implemented in performance of blocks 602, 604.

At block 606, the heated organic working fluid is pumped from the evaporator to an expander for generating power (or work generally) via expansion of the organic working fluid. For example, "hot" organic working fluid 515 is pumped (e.g., by pump 410) from the evaporator 404, 504 to the expander/generator 406 (FIG. 4) for generating power (or work generally) via expansion of the organic working fluid (i.e., at least in part now in vapor phase) 515.

In view of the foregoing, described herein are approaches to recovering/regenerating power from data center waste heat through an organic Rankine cycle. Such approaches may enable the elimination of cooling fans, and related additional power consumption, operational and environmental cost, noise, vibration etc. from the data center and/or the constituent systems and devices accordingly.

Hard Disk Drive Configuration

As discussed, embodiments may be used in the context of a data center in which multiple data storage devices (DSDs) such as hard disk drives (HDDs) are employed. Thus, in accordance with an embodiment, a plan view illustrating an HDD 100 is shown in FIG. 1A to illustrate exemplary operating components, at least in part to exemplify associated sources of operational waste heat within a data center.

FIG. 1A illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head-stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable"). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Solid State Drive Configuration

Figure 1B:
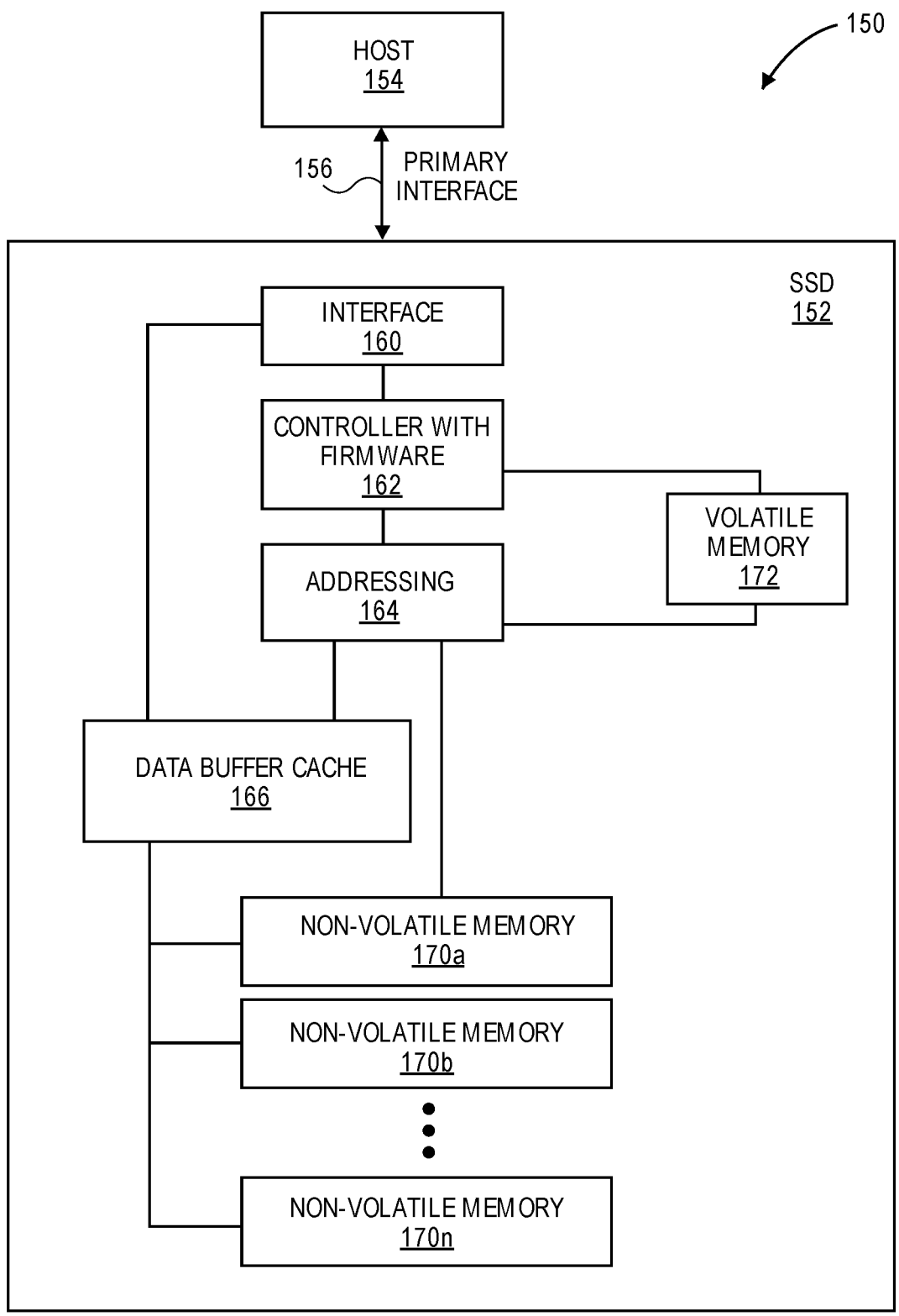
FIG. 1B is a block diagram illustrating a solid-state drive (SSD), according to an embodiment.

As discussed, embodiments may be used in the context of a data center in which multiple data storage devices (DSDs) such as solid-state drives (SSDs) are employed. Thus, FIG. 1B is a block diagram illustrating an example operating context with which embodiments of the invention may be implemented, at least in part to exemplify associated sources of operational waste heat within a data center. FIG. 1B illustrates a generic SSD architecture 150, with an SSD 152 communicatively coupled with a host 154 through a primary communication interface 156. Embodiments are not limited to a configuration as depicted in FIG. 1B, rather, embodiments may be implemented with SSD configurations other than that illustrated in FIG. 1B. For example, embodiments may be implemented to operate in other environments that rely on non-volatile memory storage components for writing and reading of data.

Host 154 broadly represents any type of computing hardware, software, or firmware (or any combination of the foregoing) that makes, among others, data I/O requests or calls to one or more memory device. For example, host 154 may be an operating system executing on a computer, a tablet, a mobile phone, or generally any type of computing device that contains or interacts with memory, such as host 350 (FIG. 3). The primary interface 156 coupling host 154 to SSD 152 may be, for example, a storage system's internal bus or a communication cable or a wireless communication link, or the like.

The example SSD 152 illustrated in FIG. 1B includes an interface 160, a controller 162 (e.g., a controller having firmware logic therein), an addressing 164 function block, data buffer cache 166, and one or more non-volatile memory components 170a, 170b-170n.

Interface 160 is a point of interaction between components, namely SSD 152 and host 154 in this context, and is applicable at the level of both hardware and software. This enables a component to communicate with other components via an input/output (I/O) system and an associated protocol. A hardware interface is typically described by the mechanical, electrical and logical signals at the interface and the protocol for sequencing them. Some non-limiting examples of common and standard interfaces include SCSI (Small Computer System Interface), SAS (Serial Attached SCSI), and SATA (Serial ATA).

An SSD 152 includes a controller 162, which incorporates the electronics that bridge the non-volatile memory components (e.g., NAND (NOT-AND) flash) to the host, such as non-volatile memory 170a, 170b, 170n to host 154. The controller is typically an embedded processor that executes firmware-level code and is an important factor in SSD performance.

Controller 162 interfaces with non-volatile memory 170a, 170b, 170n via an addressing 164 function block. The addressing 164 function operates, for example, to manage mappings between logical block addresses (LBAs) from the host 154 to a corresponding physical block address on the SSD 152, namely, on the non-volatile memory 170a, 170b, 170n of SSD 152. Because the non-volatile memory page and the host sectors are different sizes, an SSD has to build and maintain a data structure that enables it to translate between the host writing data to or reading data from a sector, and the physical non-volatile memory page on which that data is actually placed. This table structure or "mapping" may be built and maintained for a session in the SSD's volatile memory 172, such as DRAM (dynamic random-access memory) or some other local volatile memory component accessible to controller 162 and addressing 164. Alternatively, the table structure may be maintained more persistently across sessions in the SSD's non-volatile memory such as non-volatile memory 170a, 170b-170n.

Addressing 164 interacts with data buffer cache 166, in addition to non-volatile memory 170a, 170b-170n. Data buffer cache 166 of an SSD 152 typically uses DRAM as a cache, similar to the cache in hard disk drives. Data buffer cache 166 serves as a buffer or staging area for the transmission of data to and from the non-volatile memory components, as well as serves as a cache for speeding up future requests for the cached data. Data buffer cache 166 is typically implemented with volatile memory so the data stored therein is not permanently stored in the cache, i.e., the data is not persistent.

Finally, SSD 152 includes one or more non-volatile memory 170a, 170b-170n components. For a non-limiting example, the non-volatile memory components 170a, 170b-170n may be implemented as flash memory (e.g., NAND or NOR flash), or other types of solid-state memory available now or in the future. The non-volatile memory 170a, 170b-170n components are the actual memory electronic components on which data is persistently stored. The non-volatile memory 170a, 170b-170n components of SSD 152 can be considered the analogue to the hard disks in hard-disk drive (HDD) storage devices.

Furthermore, references herein to a data storage device may encompass a multi-medium storage device (or "multi-medium device", which may at times be referred to as a "multi-tier device" or "hybrid drive"). A multi-medium storage device refers generally to a storage device having functionality of both a traditional HDD (see, e.g., HDD 100) combined with an SSD (see, e.g., SSD 150) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A multi-medium storage device may be architected and configured to operate and to utilize the solid-state portion in a number of ways, such as, for non-limiting examples, by using the solid-state memory as cache memory, for storing frequently-accessed data, for storing I/O intensive data, for storing metadata corresponding to payload data (e.g., for assisting with decoding the payload data), and the like. Further, a multi-medium storage device may be architected and configured essentially as two storage devices in a single enclosure, i.e., a traditional HDD and an SSD, with either one or multiple interfaces for host connection.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicant(s) to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A system comprising:
a low-temperature preheater chamber configured to intake low-temperature waste heat from one or more relatively low-temperature electronic components and to exchange the low-temperature waste heat to an organic working fluid flowing through the preheater chamber;
a high-temperature evaporator in fluid communication with the preheater chamber and configured to intake high-temperature waste heat from one or more relatively high-temperature electronic components and to exchange the high-temperature waste heat to the organic working fluid flowing through the evaporator; and
an expander to which the heated organic working fluid is passed from the evaporator, for expansion within the expander to extract power.

2. The system of claim 1, wherein the relatively high-temperature electronic components include one or more central processing units (CPUs) housed in an electronics enclosure.

3. The system of claim 1, wherein the relatively low-temperature electronic components include one or more data storage devices housed in an electronics enclosure.

4. The system of claim 3, wherein the relatively high-temperature electronic components include one or more central processing units (CPUs) housed in the electronics enclosure with the relatively low-temperature electronic components.

5. The system of claim 1, wherein:
the preheater chamber and the evaporator are configured to thermally couple with an electronics enclosure in which the relatively low-temperature electronic components and the relatively high-temperature electronic components are housed; and
the system is configured such that the organic working fluid flows from the preheater chamber to the evaporator.

6. The system of claim 5, wherein:
the preheater chamber is configured to thermally couple with the electronics enclosure via one or more first heat exchanger; and
the evaporator is configured to thermally couple with the electronics enclosure via one or more second heat exchanger.

7. The system of claim 1, further comprising:
a plurality of preheater chambers each configured to thermally couple with a corresponding electronics enclosure in which corresponding relatively low-temperature electronic components are housed;
a plurality of evaporators each configured to thermally couple with one of the corresponding electronics enclosures, in which corresponding relatively high-temperature electronic components are housed and with which a corresponding preheater chamber is configured to thermally couple; and a manifold configured to fluidly connect two or more of the evaporators prior to passing to the expander.

8. The system of claim 1, further comprising:
a lower-temperature preheater chamber in fluid communication with the low-temperature preheater chamber and configured to intake lower-temperature waste heat, having a lower temperature than the low-temperature waste heat, from one or more relatively lower-temperature electronic components, and to exchange the lower-temperature waste heat to the organic working fluid flowing through the lower-temperature preheater chamber to the low-temperature preheater chamber.

9. The system of claim 1, wherein:
the low-temperature electronic components are immersed in the organic working fluid in the preheater chamber; and
the high-temperature electronic components are immersed in the organic working fluid in the evaporator.

10. The system of claim 9, wherein:
the low-temperature electronic components are housed in a first electronics enclosure immersed in the organic working fluid in the preheater chamber; and
the high-temperature electronic components are housed in a second electronics enclosure immersed in the organic working fluid in the evaporator.

11. The system of claim 1, wherein the preheater chamber and the evaporator comprise an integrated chamber in which the low-temperature electronic components and the high-temperature electronic components are immersed in the organic working fluid.

12. The system of claim 11, wherein the low-temperature electronic components and the high-temperature electronic components are housed in a common electronics enclosure immersed in the organic working fluid.

13. A method for recovering power from data center waste heat, the method comprising:
pumping an organic working fluid through a low-temperature preheater chamber configured to exchange low-temperature waste heat from one or more relatively low-temperature electronic components to the organic working fluid flowing through the preheater chamber;
pumping the organic working fluid through a high-temperature evaporator thermally coupled with the preheater chamber and configured to exchange high-temperature waste heat from one or more relatively high-temperature electronic components to the organic working fluid flowing through the evaporator; and
pumping the heated organic working fluid from the evaporator to an expander for generating power via expansion of the organic working fluid.

14. The method of claim 13, wherein:
pumping the organic working fluid through the low-temperature preheater chamber includes passing the organic working fluid by the relatively low-temperature electronic components comprising one or more data storage devices housed in an electronics enclosure; and
pumping the organic working fluid through the high-temperature evaporator includes passing the organic working fluid by the relatively high-temperature electronic components comprising one or more central processing units (CPUs) housed in an electronics enclosure.

15. The method of claim 14, wherein:
the relatively high-temperature electronic components and the relatively low-temperature electronic components are housed together in a shared electronics enclosure;
the preheater chamber and the evaporator are each thermally coupled with the shared electronics enclosure; and
pumping the organic working fluid through the high-temperature evaporator includes pumping the organic working fluid flowing from the preheater chamber to the evaporator.

16. The method of claim 13, further comprising:
pumping the organic working fluid from a lower-temperature preheater chamber thermally coupled with the low-temperature preheater chamber and configured to exchange lower-temperature waste heat, having a lower temperature than the low-temperature waste heat, from one or more relatively lower-temperature electronic components to the organic working fluid flowing through the lower-temperature preheater chamber.

17. The method of claim 13, wherein:
pumping the organic working fluid through the low-temperature preheater chamber includes passing the organic working fluid by the low-temperature electronic components immersed in the organic working fluid in the preheater chamber; and
pumping the organic working fluid through the high-temperature evaporator includes passing the organic working fluid by the high-temperature electronic components immersed in the organic working fluid in the evaporator.

18. The method of claim 17, wherein:
the preheater chamber and the evaporator are configured as an integrated chamber in which the low-temperature electronic components and the high-temperature electronic components are immersed in the organic working fluid; and
pumping the organic working fluid through the low-temperature preheater chamber and pumping the organic working fluid through the high-temperature evaporator comprise pumping the organic working fluid through the integrated chamber.

19. The method of claim 18, wherein pumping the organic working fluid through the low-temperature preheater chamber and pumping the organic working fluid through the high-temperature evaporator comprise passing the organic working fluid by a common electronics enclosure housing the low-temperature and the high-temperature electronic components and immersed in the organic working fluid.

20. An electronics waste heat recovery system comprising:
means for exchanging low-temperature waste heat from one or more relatively low-temperature electronic components, comprising one or more data storage devices, to an organic working fluid;
means for exchanging high-temperature waste heat from one or more relatively high-temperature electronic components, comprising one or more central processing units (CPUs), to the organic working fluid coming from the means for exchanging low-temperature waste heat; and
means for expanding the heated organic working fluid from the means for exchanging high-temperature waste heat to recover power from the low-temperature and the high-temperature waste heat.

* * * * *